(12) United States Patent
Su et al.

(10) Patent No.: US 7,168,352 B2
(45) Date of Patent: Jan. 30, 2007

(54) PROCESS FOR SAWING SUBSTRATE STRIP

(75) Inventors: Jau-Yuen Su, Kaohsiung (TW);
Tao-Yu Chen, Kaohsiung (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 741 days.

(21) Appl. No.: 09/394,918

(22) Filed: Sep. 13, 1999

(65) Prior Publication Data

US 2001/0003937 A1 Jun. 21, 2001

(51) Int. Cl.
*B26D 1/00* (2006.01)

(52) U.S. Cl. .................... 83/13; 83/33; 83/34; 83/364

(58) Field of Classification Search ............. 83/33, 83/34, 35, 36, 364, 368, 13; 29/847, 846, 29/415, 414, 412
See application file for complete search history.

(56) References Cited

U.S. PATENT DOCUMENTS

| 3,407,690 | A | * | 10/1968 | Stanley | 83/364 |
|---|---|---|---|---|---|
| 3,605,465 | A | * | 9/1971 | Timmerbeil et al. | 83/33 |
| 3,649,001 | A | * | 3/1972 | Schieven | 83/33 |
| 3,798,782 | A | * | 3/1974 | Lindahl | 83/33 |
| 3,818,790 | A | * | 6/1974 | Culp et al. | 83/431 |
| 3,992,965 | A | * | 11/1976 | Hell et al. | 83/364 |
| 4,031,789 | A | * | 6/1977 | Soodalter | 83/404.2 |
| 4,748,797 | A | * | 6/1988 | Martin | 83/404.1 |
| 4,759,809 | A | * | 7/1988 | Matsuo et al. | 156/64 |
| 5,014,415 | A | * | 5/1991 | Okada | 29/621.1 |
| 5,036,574 | A | * | 8/1991 | Kakimoto | 29/335 |
| 5,397,106 | A | * | 3/1995 | Hill | 270/58 |
| 5,577,427 | A | * | 11/1996 | Haar | 83/364 |
| 5,580,831 | A | * | 12/1996 | Roman | 437/249 |
| 5,839,337 | A | * | 11/1998 | Neu | 83/35 |
| 6,047,470 | A | * | 4/2000 | Drussel et al. | 29/847 |
| 6,219,912 | B1 | * | 4/2001 | Shimizu et al. | 29/846 |
| 6,321,739 | B1 | * | 11/2001 | Roberts | 125/35 |

* cited by examiner

*Primary Examiner*—Boyer D. Ashley
*Assistant Examiner*—Omar Flores Sánchez
(74) *Attorney, Agent, or Firm*—Bacon & Thomas, PLLC

(57) ABSTRACT

A process for sawing a substrate strip marks corresponding to substrate areas of substrate strips which are arranged side-by-side on a plate. A saw machine is mechanically moved to the substrate areas and positioned by the alignment marks of corresponding substrate areas for cutting the substrate areas of the substrate strips in the first phase. Then the saw machine is further mechanically moved to the substrate areas again and is positioned by the alignment marks of corresponding substrate areas again for cutting the substrate areas of the substrate strips in the second phase. Therefore, an error in any of the substrate areas in the first phase and second phase will not accumulate to the subsequent substrate areas in the substrate strip.

8 Claims, 2 Drawing Sheets

PROCESS FOR SAWING SUBSTRATE STRIP

BACKGROUND OF THE INVENTION

1. Field of the Invention

The present invention relates generally to a substrate sawing process and more particularly to a process for sawing a substrate strip having multi-alignment means thereon.

2. Description of the Related Art

A conventional substrate sawing process comprises an alignment for positioning a substrate strip so as to adjust the position of a saw machine and to arrange the position of the cutting tracks for substrate sawing. As shown in FIG. 1, a substrate strip 100 comprises a plurality of substrate areas 110 which are aligned along the longitudinal direction. A plurality of alignment marks 111 enclose the substrate areas 110 for positioning a saw machine and cutting marks 112 are provided for measuring or predetermining arrangement of the cutting tracks 101 of the substrate sawing process. After the saw machine is positioned and the cutting tracks 101 are arranged, the saw machine saws the substrate strip 100 along the cutting tracks 101 which are defined by the cutting marks 112, e.g. the cutting tracks 101 are imaginary lines created by two outermost cutting marks 112', shown in FIG. 1. However, in the prior art the saw machine only chooses one alignment mark 111, e.g. the outermost alignment marks 111' of the substrate strip 100 to define a reference point and utilizes the outermost cutting marks 112', located around the substrate areas 110, to predetermine the cutting tracks 101 in the first phase and the cutting tracks (not shown) in the second phase.

The substrate strip 100 is packaged in high temperature circumstances and results in an expansion. When the substrate strip 100 returns to normal temperature, shrinkage in all dimensions occurs. However, each strip has variability which results in different amounts of shrinkage of the substrate strips 100 when returning from high temperature to normal temperature. Even if the substrate strips 100 are controlled in the same process and made of the same material, the shrinkage of the substrate strip 100 is still different. Furthermore, in the prior art each substrate strip 100 is not corrected to define the cutting tracks in the first phase and the second phase. Then the saw machine detects the reference point of the alignment of the substrate areas 110 and moves to the predetermined position to cut the substrate strip 100 along the cutting tracks 101. Because the saw machine cuts the substrate strips 100 (which have different shrinkage) by the predetermined cutting tracks 101, the cutting error A of each substrate area 110 adds to the peripheral substrate areas 110 in all dimensions on the substrate strips 100, even though the cutting tracks are predetermined. Therefore, in the prior art the saw machine cannot cut the substrate strips 100 by the predetermined cutting tracks 101 defined by the cutting marks 112 after the substrate strip 100 has different shrinkage.

SUMMARY OF THE INVENTION

The present invention intends to provide a substrate sawing process that saws the substrate strips in alignment with each of the substrate areas. The saw machine is mechanically moved to the substrate areas and is positioned by the alignment of each of the substrate areas for the substrate sawing process. This reduces the cutting error in such a way as to mitigate and overcome the above problem. Because the saw machine is positioned on each of the substrate areas by corresponding alignment, a cutting error resulting from cutting of each substrate area cannot add to the peripheral substrate areas.

The primary objective of this invention is to provide a substrate sawing process for a strip of substrate that includes multi-alignment so a sawing machine can be mechanically moved to the substrate areas and can be positioned by the corresponding alignments of each of the substrate areas to reduce the cutting error. Because the saw machine is positioned on each substrate areas by corresponding alignment, a cutting error in any of the substrate areas will not accumulate to the subsequent substrate areas or substrate strips.

According to the embodiment of the present invention the substrate sawing process mainly includes the steps of providing multi-alignment marks corresponding to a plurality of substrate areas of substrate strips which are arranged side-by-side on a plate. A saw machine is mechanically moved to the substrate areas and is positioned by the alignments of corresponding substrate areas for cutting the substrate areas of the substrate strips in the first phase. And then the saw machine is further mechanically moved to the substrate areas again and is positioned by the alignments of corresponding substrate areas again for cutting the substrate areas of the strips in the second phase. Therefore, a cutting error in any of the substrate areas in the first phase and second phase will not accumulate to the subsequent substrate areas in the substrate strip.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

The substrate sawing process of the present invention mainly includes multi-alignment marks corresponding to a plurality of substrate areas of substrate strip or strips which are arranged side by side on a plate. A saw machine is mechanically moved to the substrate areas and is positioned by the alignments of corresponding substrate areas to cut the substrate areas of the strips in the first phase. Then the saw machine is further mechanically moved to the substrate areas again and is positioned by the alignments of corresponding substrate areas again to cut the substrate areas of the strips in the second phase.

Figure 2:
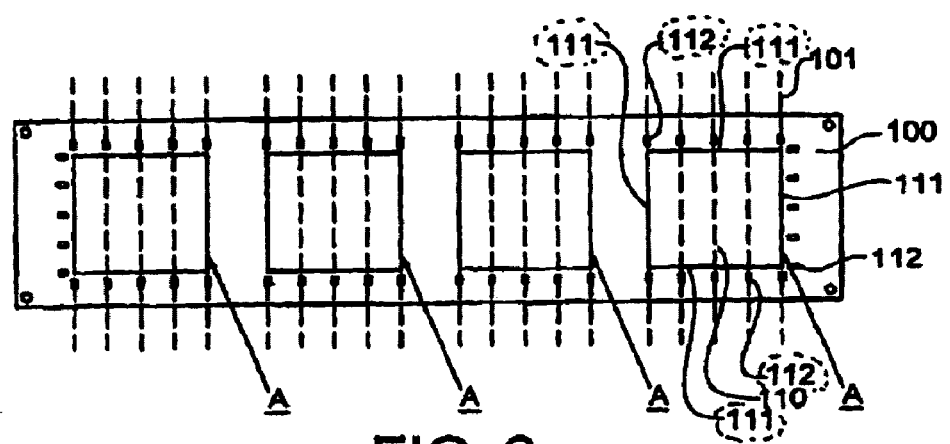
FIG. 2 is a top view of the cutting tracks of a substrate strip in the first phase in accordance with the first embodiment of the present invention.

Referring to FIG. 2, according to the first embodiment of the process for sawing substrate strip, a substrate strip 100 is placed on a plate (not shown) and is preferably suctioned to attach to the top surface of the plate through the air-holes arranged on the plate. The substrate strip 100 comprises a plurality of substrate areas 110 which are aligned in the longitudinal direction and a plurality of alignment marks 111 which are arranged around the substrate areas 110. A saw machine (not shown) is mechanically moved to the substrate areas 110 and is positioned by the alignment marks 111 of corresponding substrate areas 110. Then the saw machine measures or predetermines the cutting tracks 101 by cutting marks 112 of each substrate area 110, and then cuts the substrate areas 110 of the substrate strip 100 in the first phase. The saw machine is positioned with respect to each individual substrate area 110 according to the alignment marks 111 thereof and then the cutting tracks 101 in the first phase is defined by the cutting marks 112 on the substrate strip 100. Even though each of the strips 100 has unpredictable shrinkage caused by returning from high temperature to normal temperature, the saw machine is adjustably positioned in each of the substrate areas 110 by corresponding alignment marks 111 to avoid the error of each of the substrate areas 110 from accumulating to the subsequent substrate areas 110 during the next substrate sawing process. Therefore, the cutting error A of the substrate areas 110 is smaller than a predetermined value to provide accurate and controlled dimensions of the substrate. The alignment substantially consists of at least three points which are arranged around the encapsulated area of the substrate, and the cutting track substantially consists of two cutting marks which are arranged in the area formed by the alignment. Then the saw machine finds the reference point of alignment of each of the substrate strips 100 and cut each strip 100 along the predetermined cutting tracks in the first phase and the second phase to provide accurate and controlled dimensions of the singulated substrate. According to the preferred embodiment as shown in FIG. 2, the substrate strip 100 has a longitudinal axial and a lateral axial and the substrate areas 110 are disposed along the longitudinal axial, the saw machine is positioned with respect to the first substrate area 110 according to the alignment marks 111 along the longitudinal axial from the left and cuts the substrate strip 100 according to cutting tracks 101 defined by the cutting marks 112 parallel to the lateral axial. Then, the saw machine is positioned with respect to the second substrate area 110 from the left and then cuts the substrate strip 100. Therefore, the cutting error resulted from each substrate area 110 will not accumulate to the subsequent substrate areas in the substrate strip 100, thereby ensuring the cutting accuracy for the packaged substrate. Referring FIG. 3, after all substrate areas 110 are cut in the lateral direction of the substrate strip 100, the saw machine cuts the substrate strip 100 along the longitudinal axial thereof according to cutting tracks 101 defined by the cutting marks 112 parallel to the longitudinal axial.

Figure 1:
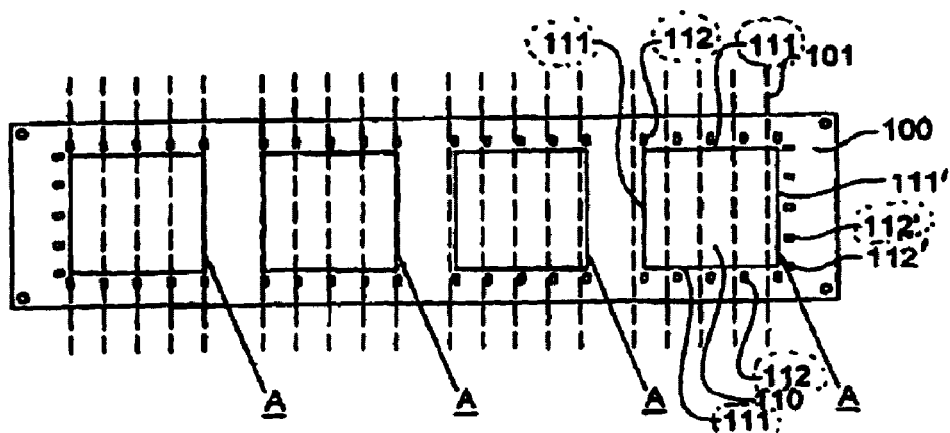
FIG. 1 is a top view of a plurality of cutting tracks of a strip.

Comparing FIG. 1 with FIG. 2, the conventional sawing process is comparable to the present invention in that the saw machine can choose only a set of the outermost alignment marks 111 of the substrate strip 100 to define a reference point and then utilizes the cutting marks 112, located around the substrate areas 110, to predetermine the cutting tracks 101 in the first phase. Because the substrate strips 100, which have unpredictable shrinkage, fail to contact the predetermined cutting tracks 101, accurate and controlled dimensions of the singulated substrate cannot be provided, and it cannot be applied to cut the substrate strip having a plurality of substrate areas. However, the saw machine of the present invention is mechanically moved to the substrate areas 110 and is positioned by the alignment marks 111 of corresponding substrate areas 110 on which are arrayed a plurality of substrates in equidistance. Therefore it is easy to measure the cutting marks 112 to define the cutting tracks 101, and the saw machine cuts each substrate strip 100 along the cutting tracks 101. The cutting error A of the substrate areas 110 is smaller than a predetermined value to provide accurate and controlled dimensions of the substrate.

Figure 3:
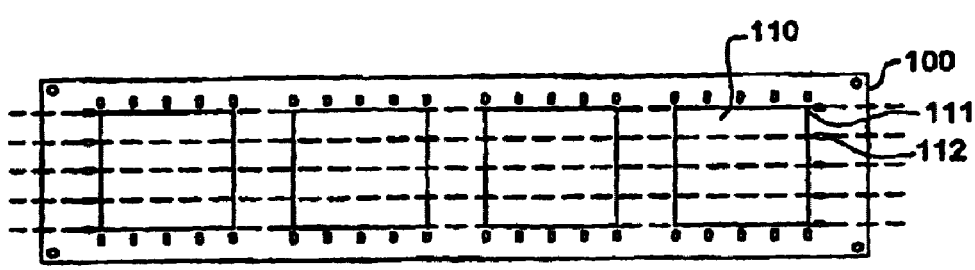
FIG. 3 is a top view of the cutting tracks of a substrate strip in the second phase in accordance with the first embodiment of the present invention.

Referring to FIG. 3, the saw machine measures or predetermines the cutting tracks 102 by cutting marks 112 of each of the substrate areas 110 in the second phase, and the cutting tracks 102 are restricted in each of the substrate areas 110. The substrate strip 100 is cut along the cutting tracks 101 and the cutting tracks 102 to form the substrate of the semiconductor device.

Figure 4:
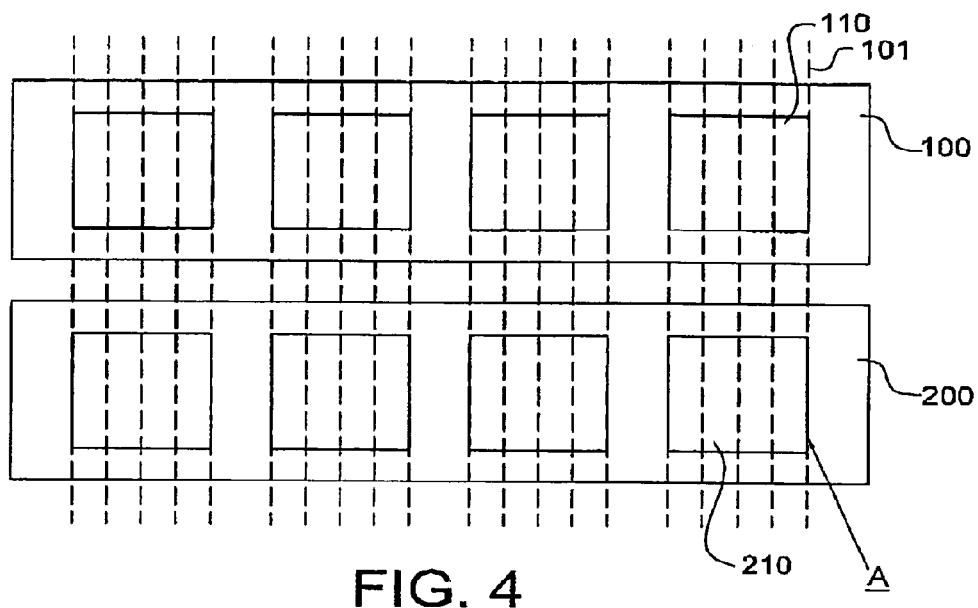
FIG. 4 is a top view of the cutting tracks of a substrate strip in the first phase in accordance with the second embodiment of the present invention.

Referring to FIG. 4, according to the second embodiment of the process for sawing substrate strip, two substrate strips 100 and 200 are juxtaposed on a plate (not shown). The substrate strips 100 and 200 have a plurality of substrate areas 110 and 210 which are adjacent to one another. The saw machine cuts the substrate strips 100 and 200 along the cutting tracks 101 in the first phase.

Figure 5:
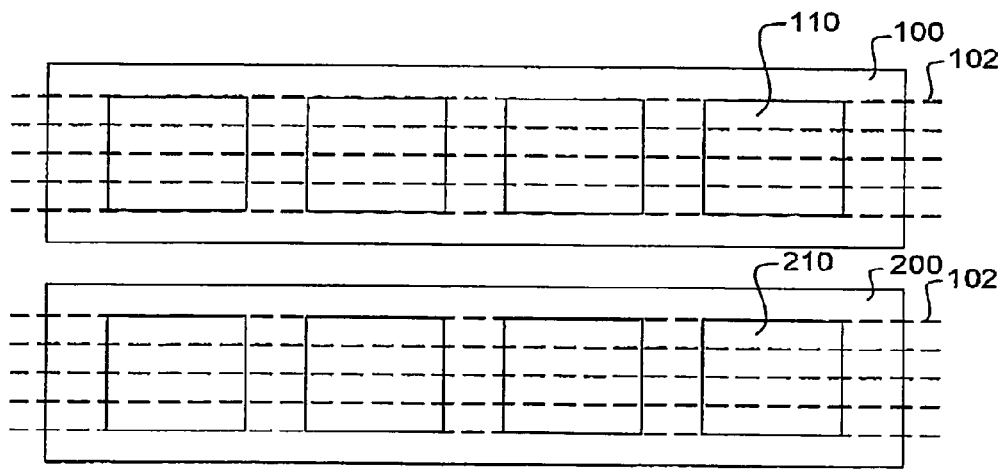
FIG. 5 is a top view of the cutting tracks of a substrate strip in the second phase in accordance with the second embodiment of the present invention.

Referring to FIG. 5, the saw machine cuts the substrate strips 100 and 200 along the cutting tracks 102 in the second phase which is restricted in each of the substrate areas 110 and 210. The substrate strips 100 and 200 are cut along the cutting tracks 101 and the cutting tracks 102 to form the substrate of the semiconductor device. Then the saw machine find the reference point of alignment of each of the substrate strips 100 and 200 and cuts each substrate strip 100 and 200 along the predetermined cutting tracks in the first phase and the second phase.

Although the invention has been described in detail with reference to its present preferred embodiment, it will be understood by one of ordinary skill in the art that various modifications can be made without departing from the spirit and the scope of the invention, as set forth in the appended claims.

What is claimed is:

1. A process for sawing a substrate strip having a plurality of substrate areas by a saw machine, and the process comprising the steps of:

providing a plurality of alignment marks around each individual substrate area on the substrate strip;

providing a plurality of cutting marks around each individual substrate area on the substrate strip;

positioning the saw machine with respect to each individual substrate area in accordance with the alignment marks there around;

cutting each individual substrate area on the substrate strip by the saw machine respectively according to cutting tracks defined by the cutting marks;

wherein the substrate strip has a longitudinal axis and a lateral axis and the substrate areas are disposed along the longitudinal axis, the saw machine is positioned with respect to a first substrate area according to the alignment marks along the longitudinal axial from one side thereof and cuts the substrate strip according to cutting tracks defined by the cutting marks parallel to the lateral axis;

repositioning the saw machine with respect to an adjacent one of the substrate areas after the substrate strip undergoes shrinkage; and cutting the substrate strip, wherein cutting error that results from each substrate area will not accumulate to the subsequent substrate areas in the substrate strip.

2. The process as claimed in claim 1, further comprising the step of cutting the substrate strip according to cutting tracks defined by the cutting marks parallel to the longitudinal axis.

3. The process as claimed in claim 1, wherein each individual substrate area is provided with at least three alignment marks.

4. The process as claimed in claim 1, further comprising an encapsulated area on each individual substrate area, and the encapsulated area is provided with at least three alignment marks there around.

5. The process as claimed in claim 1, wherein two substrate strips are juxtaposed for cutting simultaneously.

6. The process as claimed in claim 1, wherein the alignment marks are formed at the corners of each substrate area on the substrate strip.

7. A process for sawing a substrate strip having a plurality of substrate areas by a saw machine, comprising:

provided a substrate strip including a longitudinal axis and a lateral axis, a plurality of substrates areas being aligned along the longitudinal axis at regular intervals on the substrate strip;

providing a plurality of alignment marks corresponding to each individual substrate area on the substrate strip;

providing a plurality of cutting marks corresponding to each individual substrate area on the substrate strip in accordance with said plurality of alignment marks;

positioning a saw along the longitudinal axis of an individual substrate area in accordance with the alignment marks there provided;

cutting said individual substrate area parallel to the lateral axis using the saw in accordance with cutting tracks defined by the cutting marks;

repositioning the saw with respect to at least one subsequent individual substrate area after the substrate strip undergoes shrinkage; and cutting said subsequent individual substrate area on the substrate strip, wherein cutting error being generated from each individual substrate area, due to previous variable shrinkage of the substrate strip and less than a predetermined value, failing to accumulate to the subsequent substrate areas in the substrate strip.

8. The process as claimed in claim 7, wherein the alignment marks are formed at the corners of each substrate area on the substrate strip.

* * * * *